(12) United States Patent
Park et al.

(10) Patent No.: US 11,313,822 B2
(45) Date of Patent: Apr. 26, 2022

(54) NONDESTRUCTIVE METHOD FOR MEASURING ACTIVE AREA OF ACTIVE MATERIAL

(71) Applicant: LG CHEM, LTD., Seoul (KR)

(72) Inventors: Ji Hye Park, Daejeon (KR); Seok Koo Kim, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 50 days.

(21) Appl. No.: 17/055,807

(22) PCT Filed: Nov. 27, 2019

(86) PCT No.: PCT/KR2019/016452
§ 371 (c)(1),
(2) Date: Nov. 16, 2020

(87) PCT Pub. No.: WO2020/116850
PCT Pub. Date: Jun. 11, 2020

(65) Prior Publication Data
US 2021/0207941 A1 Jul. 8, 2021

(30) Foreign Application Priority Data
Dec. 3, 2018 (KR) .................. 10-2018-0153834

(51) Int. Cl.
*G01N 27/22* (2006.01)
*G01B 7/32* (2006.01)
(Continued)

(52) U.S. Cl.
CPC .............. *G01N 27/22* (2013.01); *G01B 7/32* (2013.01); *G01N 15/088* (2013.01);
(Continued)

(58) Field of Classification Search
CPC ....... G01B 7/32; G01R 27/2605; H01M 4/04; Y02E 60/10; G01N 15/088; G01N 27/22
See application file for complete search history.

(56) References Cited

U.S. PATENT DOCUMENTS 6,788,598 B2 9/2004 Chang et al.
9,349,542 B2 5/2016 Zhamu et al.
(Continued)

FOREIGN PATENT DOCUMENTS

CN 108 844 878 A 11/2018
EP 3 293 745 A1 3/2018
(Continued)

OTHER PUBLICATIONS

Extended European Search Report issued in a corresponding European Patent Application No. 19892970.5 dated Jul. 13, 2021.
(Continued)

*Primary Examiner* — Amy He
(74) *Attorney, Agent, or Firm* — Morgan, Lewis & Bockius LLP

(57) ABSTRACT

The present invention relates to a method for measuring the active area of an active material in an electrode, comprising: manufacturing three types of electrodes including a first electrode coated with an electrode mixture including both an electrode active material and a conductive material, a second electrode coated with an electrode mixture which includes the electrode active material as a main ingredient and does not include the conductive material, and a third electrode coated with an electrode mixture which does not include the active material and includes the conductive material as a main ingredient; a cell manufacturing step of manufacturing three types of monocells by using the same types of electrodes; a capacitance measuring step of measuring, from the monocells, capacitance of each electrode used in the monocells; and an active area calculating step of calculating the (Continued)

active area of the electrode active material from the capacitance.

13 Claims, 9 Drawing Sheets

(51) Int. Cl.
G01R 27/26 (2006.01)
H01M 4/04 (2006.01)
G01N 15/08 (2006.01)

(52) U.S. Cl.
CPC .......... *G01R 27/2605* (2013.01); *H01M 4/04* (2013.01); *Y02E 60/10* (2013.01)

(56) References Cited

U.S. PATENT DOCUMENTS

| | | | |
|---|---|---|---|
| 2008/0238430 A1 | 10/2008 | Page et al. | |
| 2017/0263945 A1 | 9/2017 | Li et al. | |
| 2019/0237270 A1 | 8/2019 | Weingarth et al. | |
| 2019/0363344 A1 | 11/2019 | Shen et al. | |

FOREIGN PATENT DOCUMENTS

| | | | | |
|---|---|---|---|---|
| EP | 3654026 A1 * | 5/2020 | | G01N 17/02 |
| JP | 2000-200625 A | 7/2000 | | |
| JP | 2006-503537 A | 1/2006 | | |
| JP | 2011-204460 A | 10/2011 | | |
| JP | 2012-056789 A | 3/2012 | | |
| JP | 2013-211157 A | 10/2013 | | |
| JP | 2014-081362 A | 5/2014 | | |
| JP | 6237546 B2 | 11/2017 | | |
| JP | 2017-223454 A | 12/2017 | | |
| JP | 2018-514073 A | 5/2018 | | |
| JP | 2018-127397 A | 8/2018 | | |
| KR | 10-2013-0030102 A | 3/2013 | | |
| KR | 10-2013-0126273 A | 11/2013 | | |
| KR | 10-2016-0002617 A | 1/2016 | | |
| KR | 10-2016-0049518 A | 5/2016 | | |
| KR | 10-2017-0108041 A | 9/2017 | | |
| KR | 10-2018-0027636 A | 3/2018 | | |
| KR | 10-2018-0057345 A | 5/2018 | | |
| WO | 2015/138816 A1 | 9/2015 | | |

OTHER PUBLICATIONS

Chicharro et al. "Comparative study of multi walled carbon nanotubes-based electrodes in micellar media and their application to micellar electrokinetic capillary chromatography," Talanta, 74(3), pp. 378-386 (2017).

Jenicek et al. "Modifying the characteristics of carbon nanotubes grown on metallic substrates for ultracapacitor applications," Journal of Applied Physics, 115(20) (2014).

International Search Report (with partial translation) and Written Opinion issued in corresponding International Patent Application No. PCT/KR2019/016452, dated Mar. 12, 2020.

* cited by examiner

[FIG. 1]
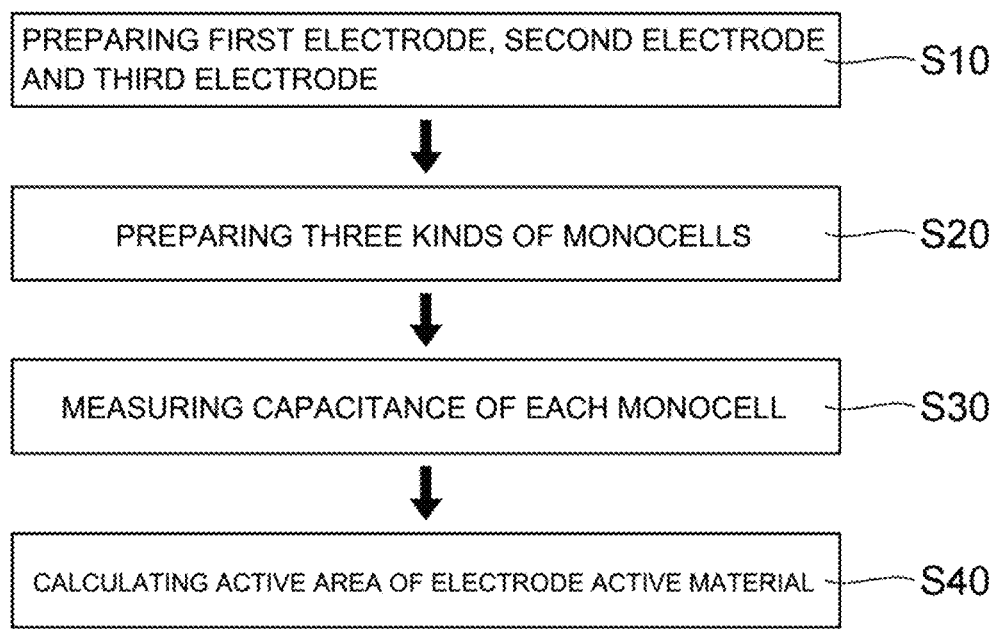

[FIG. 2]
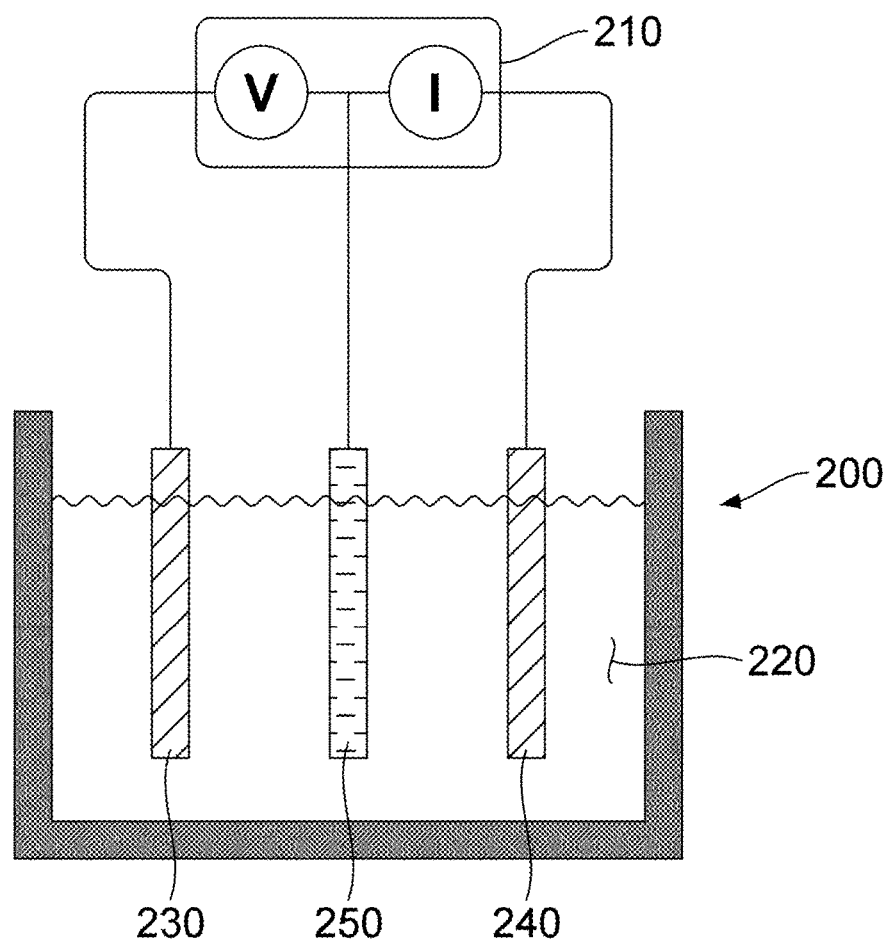

[FIG. 3]
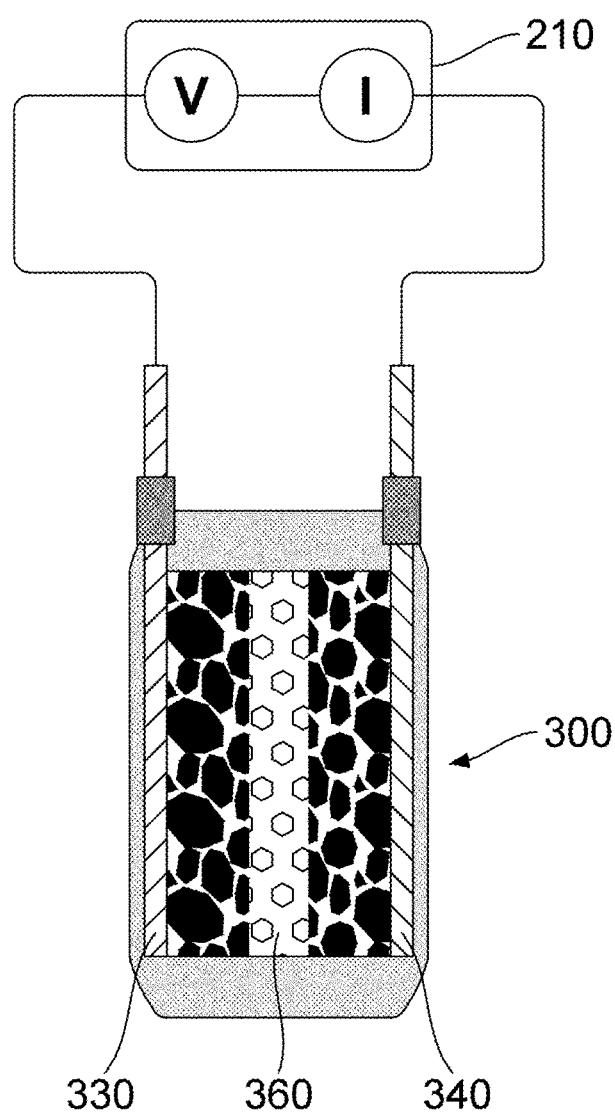

[FIG. 4]
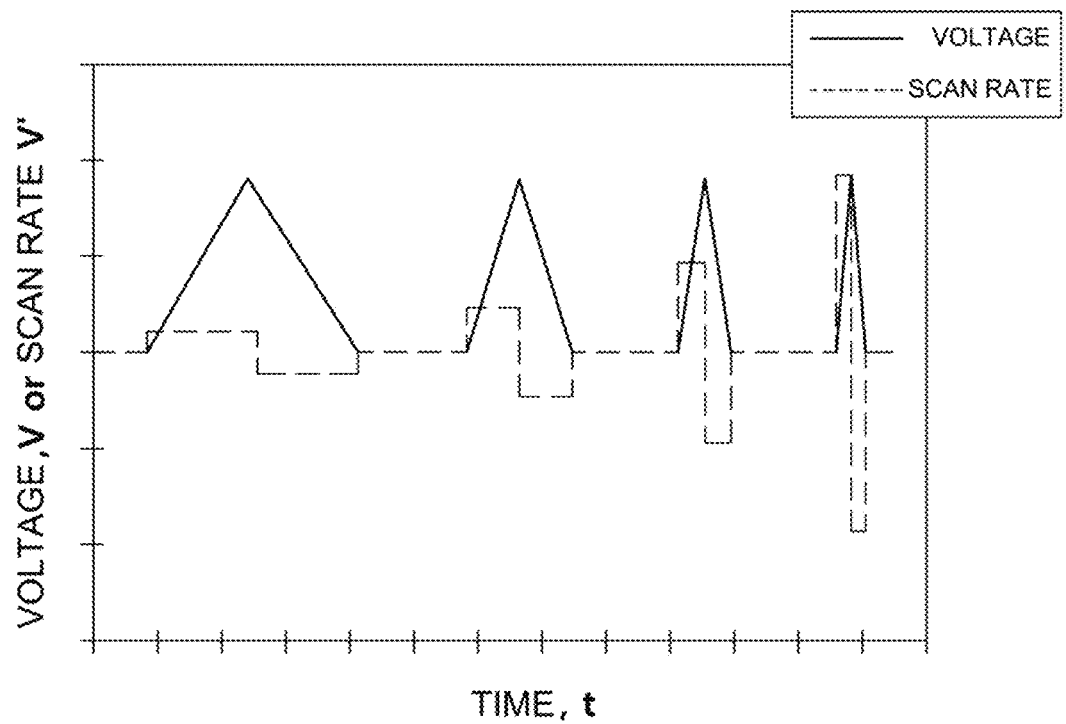
[FIG. 5]
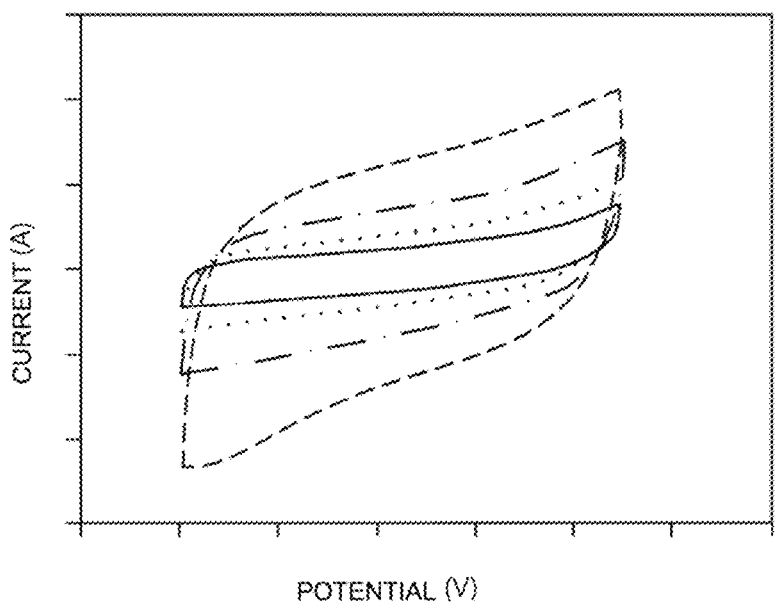

[FIG. 6]
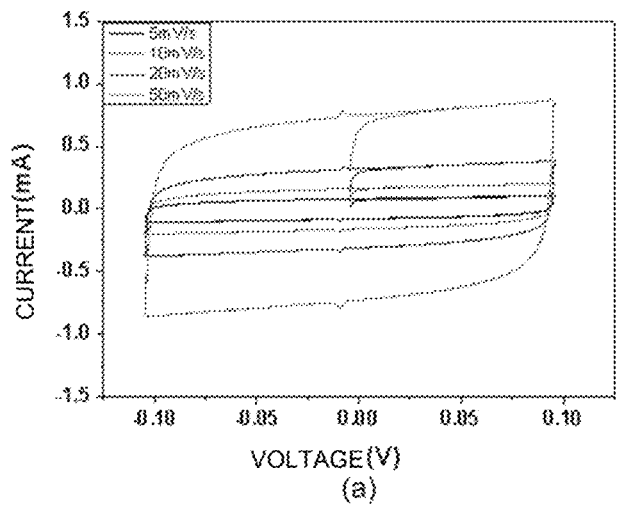
(a)
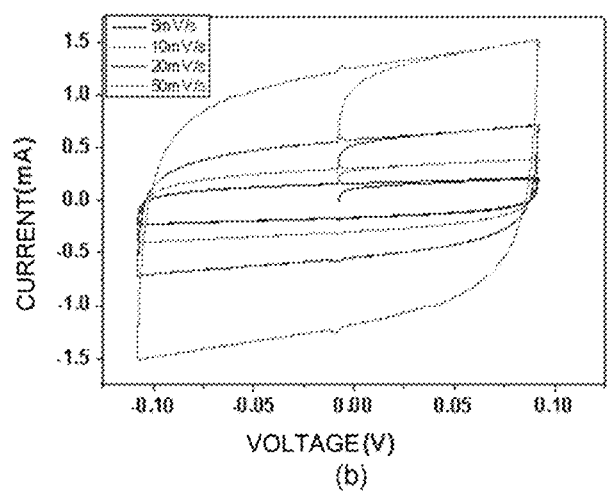
(b)
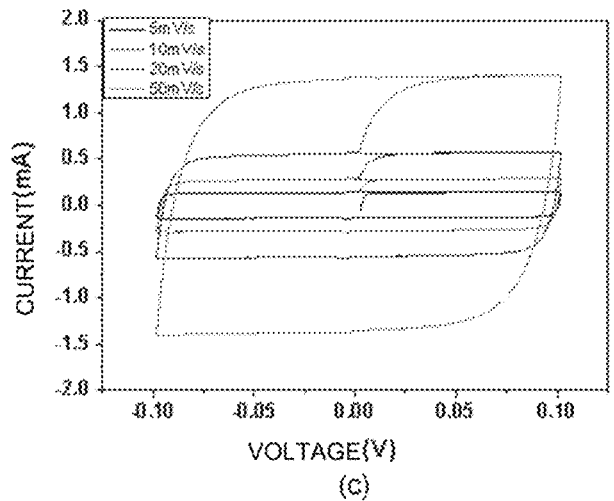
(c)

[FIG. 7]
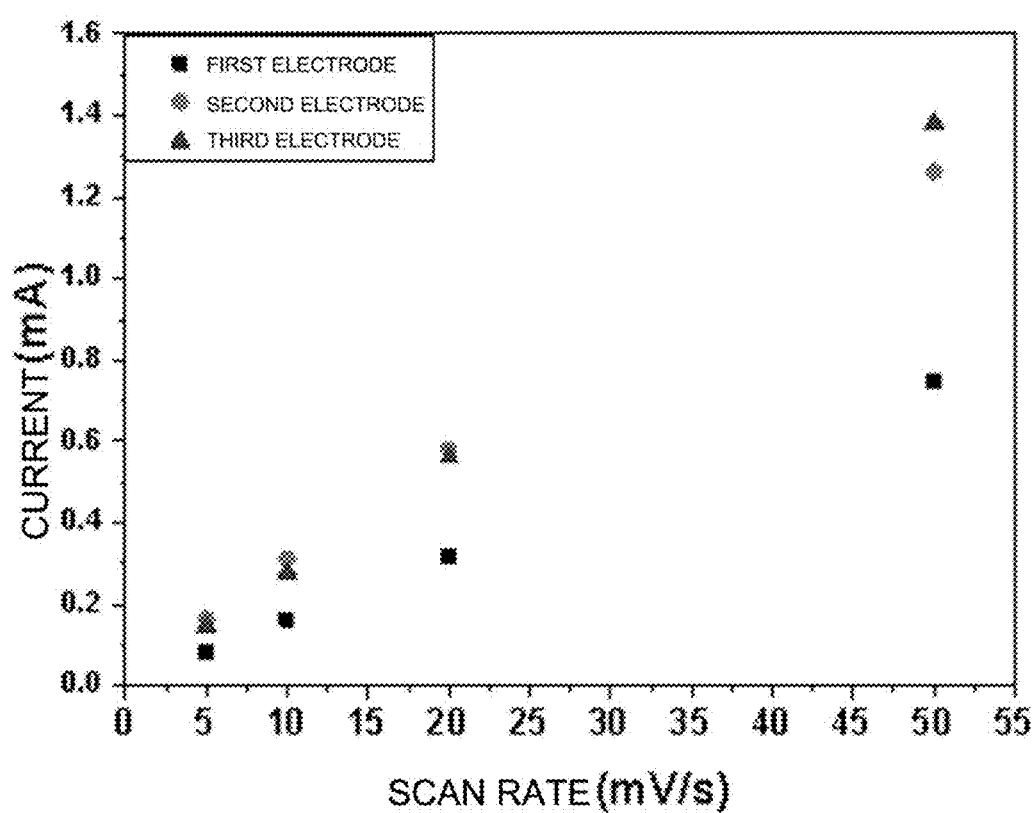

[FIG. 8]
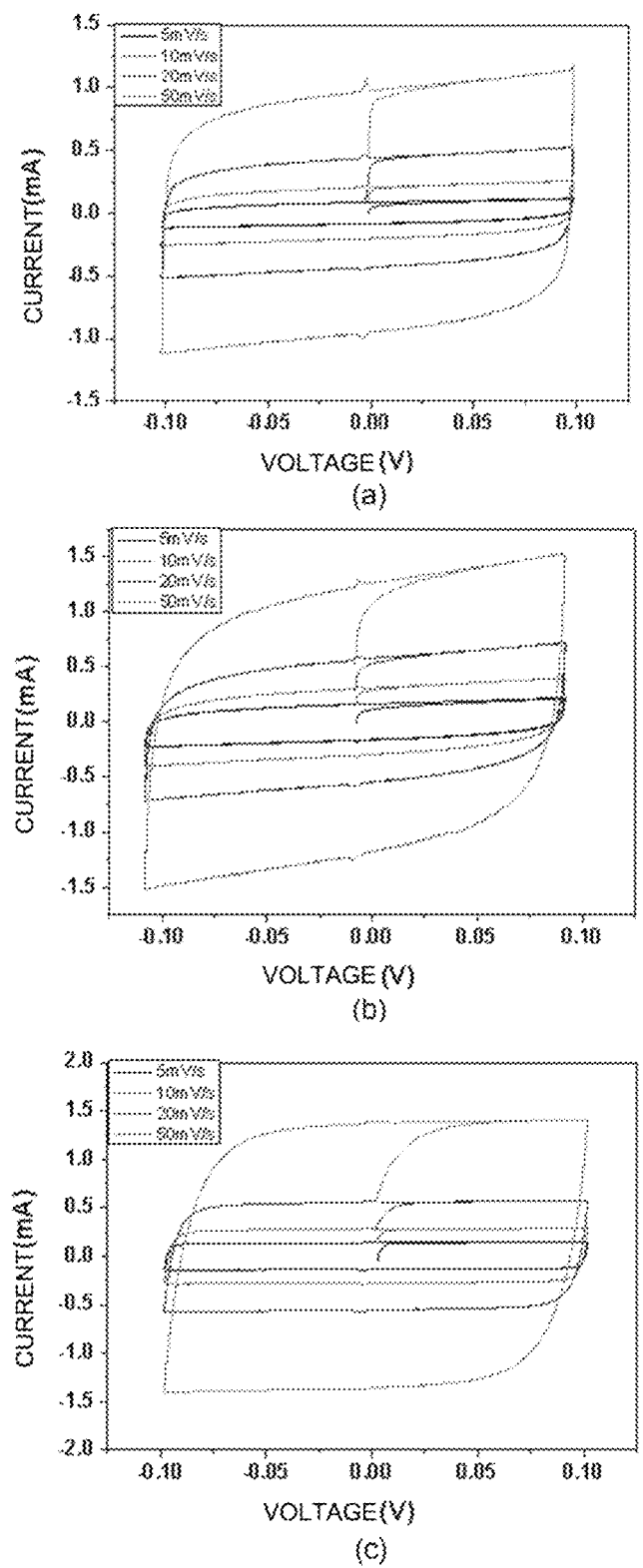

[FIG. 9]
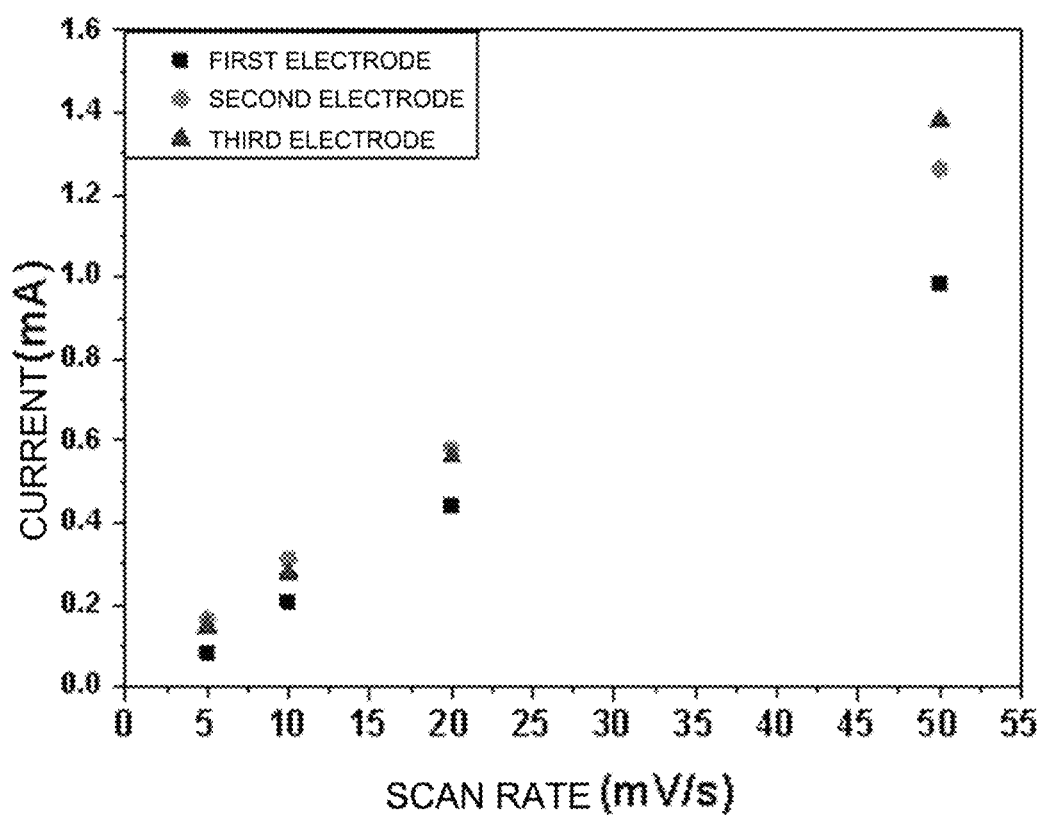

[FIG. 10]
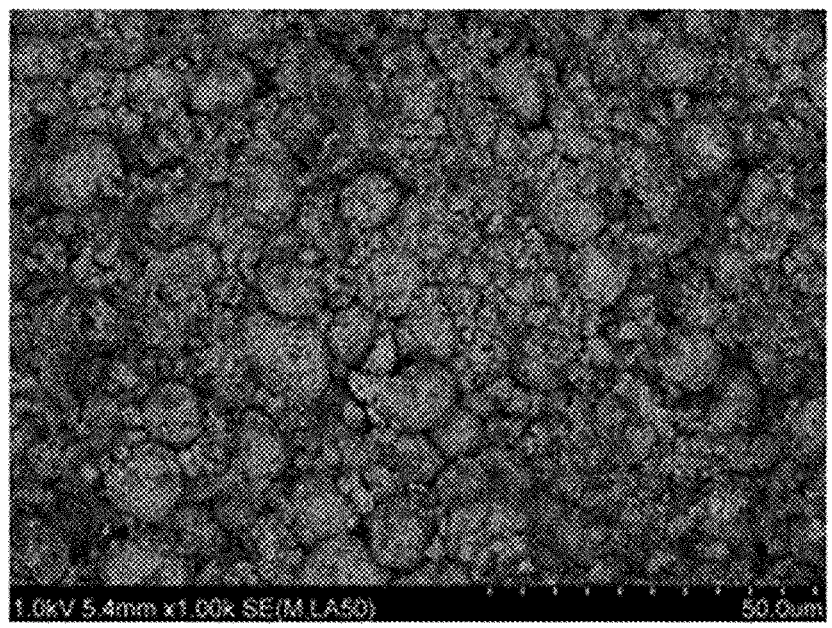
[FIG. 11]
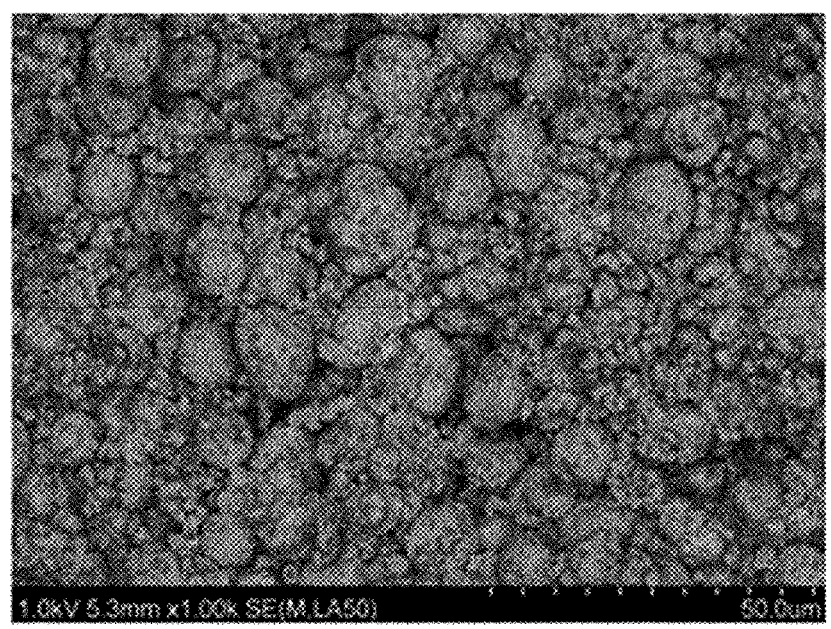

NONDESTRUCTIVE METHOD FOR MEASURING ACTIVE AREA OF ACTIVE MATERIAL

TECHNICAL FIELD

This application claims the benefit of priority based on Korean Patent Application No. 10-2018-0153834, filed on Dec. 3, 2018, and the entire contents of the Korean patent application are incorporated herein by reference.

The present invention relates to a method for measuring the active area of an active material in an electrode in a non-destructive manner.

BACKGROUND ART

As the price of energy sources increases due to depletion of fossil fuels and the interest in environmental pollution increases, the demand for environmentally friendly alternative energy sources becomes an indispensable factor for future life. Especially, as technology development and demand for mobile devices are increasing, demand for secondary batteries as energy sources is rapidly increasing.

Typically, in terms of the shape of the battery, there is a high demand for a prismatic secondary battery and a pouch-type secondary battery that can be applied to products such as mobile phones with a small thickness. In terms of materials, there is a high demand for lithium secondary batteries such as lithium ion batteries and lithium ion polymer batteries having high energy density, discharge voltage, and output stability.

Generally, in order to prepare a secondary battery, first, a positive electrode and a negative electrode are formed by applying an electrode mixture containing an electrode active material to a surface of a current collector, then a separate is interposed therebetween to thereby make an electrode assembly, which is then mounted in a cylindrical or rectangular metal can or inside a pouch-type case of an aluminum laminate sheet, and a liquid electrolyte in injected or impregnated into the electrode assembly or a solid electrolyte to prepare a secondary battery.

Further, secondary batteries are classified according to the structure of the electrode assembly having a positive electrode/separator/negative electrode structure. Representative examples thereof include a jelly-roll (wound) electrode assembly in which long sheet type positive electrodes and negative electrodes are wound with a separator interposed therebetween, a stacked electrode assembly in which a plurality of positive and negative electrodes cut in a predetermined size unit are sequentially stacked with a separator interposed therebetween, and a stacked/foldable electrode assembly in which bi-cells or full cells, in which positive and negative electrodes of a predetermined unit are stacked with a separator interposed therebetween, are wound with a separator sheet.

On the other hand, the electrode generates a current through the exchange of ions, and the positive electrode and negative electrode constituting the electrode has a structure in which the electrode active material is applied to the electrode current collector made of metal.

In general, the negative electrode has a structure in which a carbon-based active material is coated on an electrode plate made of copper or aluminum, and the positive electrode has a structure in which an active material made of $LiCoO_2$, $LiMnO_2$, $LiNiO_2$, or the like is coated on an electrode plate made of aluminum, etc.

In order to manufacture a positive electrode or a negative electrode, an electrode mixture including an electrode active material is coated on an electrode current collector made of a long metal sheet in one direction.

The separator is positioned between the positive electrode and the negative electrode of the battery to perform insulation and maintain the electrolyte to provide a passage for ion conduction.

The secondary battery is a rechargeable battery that is manufactured using a material that can repeat a plurality of redox processes between a current and a material. When the reduction reaction is performed on the material by the current, the power is charged, and when the oxidation reaction is performed on the material, the power is discharged. Herein, as the charge-discharge is repeatedly performed, electricity is generated.

In general, since the high-density electrode is formed by forming the electrode active material particles having a size of several μm to several tens of μm by a high-pressure press, the particles are deformed, the space between the particles is reduced, and electrolyte permeability is likely to be lowered.

In order to solve such a problem, a conductive material having excellent electrical conductivity and strength is used at the time of manufacturing an electrode. When a conductive material is used in the production of an electrode, the conductive material is dispersed among the compressed electrode active materials, thereby allowing micropores to be maintained between the active material particles, thereby facilitating the penetration of the electrolyte and reducing the resistance in the electrode due to excellent conductivity.

Among such conductive materials, the use of carbon nanotubes (CNTs), which are fibrous carbon-based conductive materials capable of further reducing electrode resistance by forming an electrically conductive path in the electrode, is increasing.

However, when carbon nanotubes are introduced into the electrode, carbon nanotubes may surround the active material and reduce the active area of the active material, thereby increasing resistance and reducing capacity. Hence, it is necessary to prepare an electrode by introducing an appropriate amount of carbon nanotubes.

Therefore, there is a need to measure the active area of an electrode using carbon nanotubes as a conductive material. However, according to the conventional art, in order to confirm the size of the active area of the electrode, a method of observing the surface of the electrode through an electron microscope has been used. Although it was possible to obtain a relatively accurate measurement value through the method, the method requires a lot of time and effort for the measurement because the surface of the electrode should be observed directly with the naked eye. Therefore, there is a need for technology development for solving the problem.

DISCLOSURE

Technical Problem

The present invention has been made to solve the above problems, and an object of the present invention is to provide a method for measuring the active area of the non-destructive active material capable of obtaining accurate active area measurements without damaging the electrode and reducing the time required for measurement by measuring the capacitance of the electrode coated with the electrode mixture containing the target active material and the conductive material and measuring the active area of the active material therefrom.

Technical Solution

According to an example of the present invention, a method for measuring an active area of a non-destructive active material may include:

manufacturing three kinds of electrodes of a first electrode coated with an electrode mixture containing both the electrode active material and a conductive material, a second electrode coated with an electrode mixture containing the electrode active material as its main component and not containing the conductive material, and a third electrode coated with the electrode mixture containing no active material and containing the conductive material as its main component;

manufacturing three kinds of monocells using the same kind of electrodes;

measuring a capacitance of each electrode used in the monocells from the monocells; and calculating the active area of the electrode active material by a following formula 1 from the capacitance.

In addition, in the method for measuring the active area of the non-destructive active material according to the present invention, the active area may be calculated by the following formula 1.

$$A_{A.M} = (C_{total} - C_{CNT} * A_{CNT})/C_{A.M}$$  [Formula 1]

(In Formula 1, $A_{A.M}$ denotes the active area (m$^2$) of the electrode active material in the electrode mixture coated on the first electrode, $A_{CNT}$ denotes the surface area (m$^2$) of the conductive material (CNT) in the electrode mixture coated on the first electrode, $C_{total}$ denotes the capacitance (F) of the first electrode, $C_{CNT}$ denotes the capacitance per unit surface area of the conductive material (F/m$^2$), and $C_{A.M}$ denotes the capacitance per unit surface area of the electrode active material (F/m$^2$).)

In addition, in the method for measuring the active area of a non-destructive active material according to the present invention, the surface area may be derived from a specific surface area measured by Brunauer-Emmett-Teller (BET).

In addition, in the method for measuring the active area of a non-destructive active material according to the present invention, the monocell may be a two-electrode symmetric cell using the same type of electrode.

In addition, in the method for measuring the active area of the non-destructive active material according to the present invention, the conductive material may be carbon nanotubes (CNT).

In addition, in the method for measuring the active area of the non-destructive active material according to the present invention, the electrode active material may be a positive electrode active material, and the electrode may be a positive electrode. More preferably, the electrode active material may be lithium nickel cobalt manganese composite oxide.

In addition, in the method for measuring the active area of a non-destructive active material according to the present invention, the capacitance measuring step may be to measure the capacitance of the electrode through cyclic voltammetry with respect to the monocell.

Further, in a method for measuring an active area of a non-destructive active material according to the present invention, the measuring of the capacitance may include: applying a voltage to the monocells at a constant scan rate;

measuring a response current according to the applied voltage; and showing a cyclic voltammogram from a relationship between the scan rate of the applied voltage and the response current and calculating capacitance therefrom.

In addition, in the method for measuring the active area of a non-destructive active material according to the present invention, the capacitance calculation step may be a linear regression method of calculating a slope by drawing a response current according to a voltage scan ratio in a straight line form.

In addition, in the method for measuring the active area of the non-destructive active material according to the present invention, in the current measuring step, the response current may be measured at the point where the x-axis value is OV in the cyclic voltammogram.

In addition, in the method for measuring the active area of a non-destructive active material according to the present invention, the first electrode may be included at the amount of 95:3:1.5:0.5 to 98:0.5:1:0.5 based on a weight ratio of an electrode active material, a conductive material, a binder, and a dispersant.

In addition, in the method for measuring the active area of the non-destructive active material according to the present invention, the second electrode may include 99.5 to 99.8 wt % of the electrode active material.

In addition, in the method for measuring the active area of a non-destructive active material according to the present invention, the third electrode may be coated with a pre-dispersion liquid containing a conductive material as a main component.

Advantageous Effects

In the method for measuring the active area of a non-destructive active material according to the present invention, by measuring the capacitance of the electrode coated with the target electrode active material and measuring the active area of the active material therefrom, an accurate active area measurement can be obtained without damaging the electrode, and the time required for measurement can be reduced.

BRIEF DESCRIPTION OF THE DRAWINGS

FIG. 1 is a flowchart showing the flow of a method for measuring the active area of the non-destructive active material according to the present invention.

FIG. 2 is a schematic diagram showing a schematic view of a mono cell that can be used when measuring the capacitance of the present invention.

FIG. 3 is a schematic diagram showing the appearance of another embodiment of the mono-cell that can be used when measuring the capacitance of the present invention.

FIG. 4 is a graph showing the shape and voltage scan rate of the voltage applied to a monocell in a method for measuring the active area of a non-destructive active material according to the present invention.

FIG. 5 is a graph illustrating a general cyclic voltammogram curve according to a voltage scan ratio.

FIG. 6 is a graph illustrating a cyclic voltammogram curve according to a voltage scan ratio of each electrode according to Preparation Example 1 of the present invention.

FIG. 7 is a graph showing the current value for the voltage scan ratio according to Preparation Example 1 of the present invention.

FIG. 8 is a graph illustrating a cyclic voltammogram curve according to a voltage scan ratio of each electrode according to Preparation Example 2 of the present invention.

FIG. 9 is a graph showing the current value for the voltage scan ratio according to Preparation Example 2 of the present invention.

FIG. 10 is a photograph taken with a scanning electron microscope (SEM) of the first electrode of Preparation Example 1 of the present invention.

FIG. 11 is a photograph taken with a scanning electron microscope (SEM) of the first electrode of Preparation Example 2 of the present invention.

DETAILED DESCRIPTION OF THE PREFERRED EMBODIMENTS

The terms and words used in the present specification and claims should not be construed as limited to ordinary or dictionary terms and the inventor may properly define the concept of the terms in order to best describe its invention. The terms and words should be construed as meaning and concept consistent with the technical idea of the present invention. Accordingly, the embodiments described in the specification and the configurations described in the drawings are only the most preferred embodiments of the present invention, and do not represent all of the technical ideas of the present invention. It is to be understood that there may be various equivalents and variations in place of them at the time of filing the present application.

In the present specification, when a part is "connected" to another part, this includes not only "directly connected" but also "electrically connected" between the parts while having another element therebetween.

In this application, it should be understood that terms such as "include" or "have" are intended to indicate that there is a feature, number, step, operation, component, part, or a combination thereof described on the specification, and they do not exclude in advance the possibility of the presence or addition of one or more other features or numbers, steps, operations, components, parts or combinations thereof. Also, when a portion such as a layer, a film, an area, a plate, etc. is referred to as being "on" another portion, this includes not only the case where the portion is "directly on" the another portion but also the case where further another portion is interposed therebetween. On the other hand, when a portion such as a layer, a film, an area, a plate, etc. is referred to as being "under" another portion, this includes not only the case where the portion is "directly under" the another portion but also the case where further another portion is interposed therebetween. In addition, to be disposed "on" in the present application may include the case disposed at the bottom as well as the top.

As used throughout this specification, the terms "about", "substantially", and the like, are used to mean a value or something like this when unique manufacturing and material tolerances are presented, and the terms are used to prevent unscrupulous infringers from unfair use of the disclosure including accurate or absolute figures in order to aid in the understanding of the present disclosure.

Throughout this specification, the term "combination(s) thereof" included in the expression of the Markush form means one or more mixtures or combinations selected from the group consisting of the elements described in the Markush form representation, and it means to include one or more selected from the group consisting of the above components.

Hereinafter, the present invention will be described in detail.

FIG. 1 is a flowchart showing the flow of a method for measuring the active area of the non-destructive active material according to the present invention.

Referring to FIG. 1, a method for measuring an active area of a non-destructive active material according to the present invention includes: manufacturing three kinds of electrodes of a first electrode coated with an electrode mixture containing both the electrode active material and a conductive material, a second electrode coated with an electrode mixture containing the electrode active material as its main component and not containing the conductive material, and a third electrode coated with the electrode mixture containing no active material and containing the conductive material as its main component (S10); manufacturing three kinds of monocells using the same kind of electrodes (S20); measuring a capacitance of each electrode used in the monocells from the monocells (S30); and calculating the active area of the electrode active material by a following formula 1 from the capacitance (S40).

In addition, the electrode active material may be a positive electrode active material, and the first electrode, the second electrode, and the third electrode may be positive electrodes. Further, the conductive material is preferably carbon nanotubes (CNT).

In general, in order to develop a high capacity battery, the thickness of the electrode generally needs to be thick, and the electrons need to be smoothly transferred from the thickened electrode to the current collector. However, in the case of carbon black, which is a zero-dimensional structure that is conventionally applied as a conductive material in a secondary battery, it does not make an effective conductive path and has a disadvantage in that it does not meet the above technical requirements properly.

In addition, in order to develop the high capacity battery described above, application of new materials such as silicon-based negative electrode active materials and new lithium composite metal oxide-based positive electrode active materials has been widely studied and attempted. However, in order to apply such a new material, for example, a high-capacity material such as a silicon-based negative electrode active material, it has become necessary to solve new technical demands such as preventing breakage of non-conductor or silicon while maintaining a conductive structure during charge and discharge. In order to solve these new technical requirements and further improve the electrical characteristics of the battery, for example, electrical conductivity, such as electrical conductivity, it is preferable to use carbon nanotubes, which are one-dimensional fiber structures, instead of carbon black, which has been used as a conductive material for electrodes. In particular, the carbon nanotubes exhibit not only excellent electrical conductivity and thermal conductivity, but also can maintain an effective conductive structure as a conductive material in the form of fiber, and thus are in the spotlight as a new conductive material that replaces existing materials.

However, as described above, the carbon nanotubes may increase the resistance and reduce the capacity by reducing the active area of the active material while the carbon nanotubes surround the active material. When the active area of the active material is reduced, the area in which the active material is in contact with the electrolyte is reduced, which is a kinetic disadvantage, and thus, the initial capacity becomes relatively low. Therefore, by measuring the active area of the electrode active material according to the content of the carbon nanotubes as in the present invention, an appropriate amount of carbon nanotube conductive materials can be added.

Specifically, in the method for measuring the active area of the active material according to the present invention, the electrode manufacturing step S10 includes manufacturing three kinds of electrodes having different compositions.

First, the first electrode is an electrode to be generally used for a secondary battery and may be manufactured by applying an electrode mixture containing an electrode active material on a current collector and then drying the electrode mixture. The electrode mixture may further include a binder, a conductive material, a filler, and the like, as necessary.

In particular, the electrode active material is a positive electrode active material, the electrodes may act as a positive electrode, and the conductive material may be carbon nanotubes (CNT) as described above. Carbon nanotubes are secondary structures formed by gathering carbon nanotube units in whole or in part in bundles. The carbon nanotube units have a graphite sheet having a cylinder shape of nano size diameter, and have a $sp^2$ bonding structure. In this case, the graphite surface may exhibit characteristics of a conductor or a semiconductor depending on the angle and structure of the surface. Carbon nanotube units may be classified into single-walled carbon nanotubes (SWCNTs), double-walled carbon nanotubes (DWCNTs) and multi-walled carbon nanotubes (MWCNTs), depending on the number of bonds in the wall. The structure and shape of the secondary particles composed of the unit can be freely selected according to the nature of the electrode and battery to be produced, the crystallinity and structure and shape of the unit constituting the carbon nanotube, The current collector is not particularly limited as long as it has high conductivity without causing a chemical change in the battery. For example, the current collector may be made of a metal such as stainless steel, aluminum, nickel, titanium, sintered carbon, or aluminum or stainless steel of which the surface is treated with carbon, nickel, titanium, or silver, or the like. The current collector may have fine irregularities on the surface thereof to increase the adhesion of the positive electrode active material, and various forms such as a film, a sheet, a foil, a net, a porous body, a foam, and a nonwoven fabric are possible.

Further, the positive electrode active material is a material capable of causing an electrochemical reaction and a lithium transition metal oxide, and contains two or more transition metals. Examples thereof include: layered compounds such as lithium cobalt oxide ($LiCoO_2$) and lithium nickel oxide ($LiNiO_2$) substituted with one or more transition metals; lithium manganese oxide substituted with one or more transition metals; lithium nickel oxide represented by the formula $LiNi_{1-y}M_yO_2$ (wherein M=Co, Mn, Al, Cu, Fe, Mg, B, Cr, Zn or Ga and contains at least one of the above elements, $0.01 \leq y \leq 0.7$); lithium nickel cobalt manganese composite oxide represented by the formula $Li_{1+z}Ni_bMn_cCo_{1-(b+c+d)}M_dO_{(2-e)}A_e$ such as $Li_{1+z}Ni_{1/3}Co_{1/3}Mn_{1/3}O_2$, $Li_{1+z}Ni_{0.4}Mn_{0.4}Co_{0.2}O_2$ etc. (wherein $-0.5 \leq z \leq 0.5$, $0.1 \leq b \leq 0.8$, $0.1 \leq c \leq 0.8$, $0 \leq d \leq 0.2$, $0 \leq e \leq 0.2$, b+c+d<1, M=Al, Mg, Cr, Ti, Si or Y, and A=F, P or Cl); olivine-based lithium metal phosphate represented by the formula $Li_{1+x}M_{1-y}M'_yPO_{4-z}X_z$ (wherein M=transition metal, preferably Fe, Mn, Co or Ni, M'=Al, Mg or Ti, X=F, S or N, and $-0.5 \leq x \leq 0.5$, $0 \leq y \leq 0.5$, $0 \leq z \leq 0.1$). There is no particular limitation on the positive electrode active material used in the present invention, but as described below, lithium nickel cobalt manganese composite oxide is most preferred.

In general, lithium cobalt oxide (LCO) such as $LiCoO_2$ may be used as a positive electrode active material. The lithium cobalt oxide is an excellent material having high stability and flat discharge voltage characteristics, but Co is undesirable because of its low reserves and high cost and its toxicity to humans. $LiNiO_2$-based positive electrode active materials are relatively inexpensive and exhibit high discharge capacity, but they have problems that the rapid phase transition of the crystal structure occurs due to the volume change accompanying the charge and discharge cycle, and the safety decreases rapidly when exposed to air and moisture. Lithium manganese oxides such as $LiMnO_2$ and $LiMn_2O_4$ have advantages of excellent thermal safety and low price, but have problems of small capacity and poor cycle characteristics. Lithium nickel cobalt manganese composite oxide (NCM) is a material with its own advantages and has many advantages in terms of safety, life and price.

The binder is added in an amount of 1 to 30% by weight, on the basis of the total weight of the mixture containing the positive electrode active material, as a component that assists in bonding between the active material and the conductive material and bonding to the current collector. Examples of such binders include polyvinylidene fluoride, polyvinyl alcohol, carboxymethylcellulose (CMC), starch, hydroxypropylcellulose, regenerated cellulose, polyvinylpyrrolidone, tetrafluoroethylene, polyethylene, polypropylene, ethylene-propylene-diene terpolymer (EPDM), sulfonated EPDM, styrene butylene rubber, fluorine rubber, various copolymers and the like.

The filler is optionally used as a component for inhibiting expansion of an electrode, and is not particularly limited as long as it is a fibrous material without causing a chemical change in the battery. Examples of the filler include olefin polymers such as polyethylene and polypropylene; fibrous materials such as glass fibers and carbon fibers.

Other components, such as viscosity modifiers, adhesion promoters, and the like may be further included optionally or in combination of two or more. The viscosity modifier is a component that adjusts the viscosity of the electrode mixture so that the mixing process of the electrode mixture and the coating process on the current collector thereof may be easy, and may be added up to 30% by weight based on the total weight of the electrode mixture. Examples of such a viscosity modifier include carboxy methyl cellulose, polyvinylidene fluoride, and the like, but are not limited thereto. In some cases, the solvent described above may serve as a viscosity modifier.

The adhesion promoter is an auxiliary component added to improve the adhesion of the active material to the current collector and may be added in less than 10% by weight compared to the binder, and some examples thereof include oxalic acid, adipic acid, formic acid, acrylic acid derivatives, itaconic acid derivatives, and the like.

In the first electrode, the electrode mixture coated on the electrode includes an electrode active material, a conductive material, a binder and a dispersant in a ratio of 95:3:1.5:0.5 to 98:0.5:1:0.5 based on the weight ratio, and more preferably, the active material may be included in a ratio of 96 to 98% by weight. The active area of the active material may be optimized within the ratio range to have excellent electrical conductivity, that is, to obtain a low resistance and high capacity electrode.

Second, the second electrode includes an electrode active material as a main component and is coated with an electrode mixture containing no conductive material. Specifically, the second electrode includes an electrode active material and a small amount of binder for attaching the active material to a current collector. The content of the binder in the second electrode may be 0.2 to 0.5% by weight, more preferably 0.3 to 0.5% by weight. Accordingly, the content of the electrode active material in the second electrode may be 99.5 to 99.8% by weight, more preferably 99.5 to 99.7% by weight. When the content of the binder is less than 0.2% by weight, the adhesion of the electrode active material to the current collector may be reduced. When the content of the binder is more than 0.5% by weight, the content of the electrode active material is decreased, so that the active area value of the active material may be inaccurate. Moreover, after preparing the electrode, it is preferable to roll the electrode to have the porosity of about 20%.

Finally, the third electrode includes a conductive material as a main component, and is coated with an electrode mixture containing no electrode active material. Specifically, the third electrode may be obtained by coating the current collector with a pre-dispersion liquid containing a conductive material, preferably carbon nanotubes (CNT). The pre-dispersion liquid may be obtained by adding the conductive material and the dispersant to the dispersion medium, thereby increasing the dispersibility of the carbon nanotube conductive material having low dispersibility.

The carbon nanotubes may also be included in an amount of 0.5 wt % to 30 wt %, more specifically 0.5 wt % to 10 wt %, based on the total weight of the conductive material dispersion. When the carbon nanotubes are included in the content in the above range, in the electrode produced later, it is possible to balance the electronic conductivity and dispersibility of the electrode.

The dispersant may be at least one selected from the group consisting of polyvinylpyrrolidone, poly3,4-ethylenedioxythiophene, and mixtures thereof. The dispersion medium may be at least one selected from the group consisting of amide polar organic solvents such as deionized water, dimethylformamide (DMF), diethyl formamide, dimethyl acetamide (DMAc), and N-methyl pyrrolidone (NMP); alcohols such as methanol, ethanol, 1-propanol, 2-propanol (isopropyl alcohol), 1-butanol (n-butanol), 2-methyl-1-propanol (isobutanol), 2-butanol (sec-butanol), 1-methyl-2-propanol (tert-butanol), pentanol, hexanol, heptanol and octanol; glycols such as ethylene glycol, diethylene glycol, triethylene glycol, propylene glycol, 1,3-propanediol, 1,3-butanediol, 1,5-pentanediol, and hexylene glycol; polyhydric alcohols such as glycerin, trimetholpropane, pentaerythritol, and sorbitol; glycol ethers such as ethylene glycol mono methyl ether, diethylene glycol mono methyl ether, triethylene glycol mono methyl ether, tetra ethylene glycol mono methyl ether, ethylene glycol mono ethyl ether, diethylene glycol monoethyl ether, triethylene glycol mono ethyl ether, tetra ethylene glycol mono ethyl ether, ethylene glycol mono butyl ether, diethylene glycol mono butyl ether, triethylene glycol mono butyl ether, and tetra ethylene glycol monobutyl ether, and mixtures thereof.

When the electrode manufacturing step is completed, a monocell is prepared from the three kinds of prepared electrodes (S20).

FIG. 2 is a schematic diagram showing a schematic view of a mono cell that can be used when measuring the capacitance of the present invention, FIG. 3 is a schematic diagram showing the appearance of another embodiment of the mono-cell that can be used when measuring the capacitance of the present invention.

The monocell 200 is manufactured to measure the capacitance of each electrode. In general, a cell manufactured for cyclic voltammetry is performed using three electrode sets as shown in FIG. 2. The three electrodes include a working electrode 230, a counter electrode 240, and a reference electrode 250. The electrode used for the measurement in the cyclic voltammetry is the working electrode 230, and redox reactions occur for the characteristics of the battery system. The counter electrode 240 maintains the opposite electrical potential of the working electrode 230.

The electrolyte 220 may generally be used as a reactant for the applied voltage of the working electrode 230. The reference electrode 250, also referred to as a reference electrode, serves as a reference for measuring electrode potential and may operate as a feedback sensor for measuring and monitoring a potential of a counter electrode to maintain a constant voltage and a constant current. In general, the reference electrode 250 is made of a material that is stable within the applied voltage range, and includes a material selected from the group consisting of silver-silver chloride (Ag|AgCl), copper-copper sulfate (Cu|Cu(II)SO4), silver-silver bromide (Ag|AgBr), mercury-mercury chloride (Hg|Hg2Cl2), and copper-copper pyrophosphate.

In general, the counter electrode may be made of platinum or platinum coated titanium, but in the active area measuring method of the active material according to the present invention, only the capacitance is measured by symmetrically using the same electrode as the counter electrode so as not to cause an electrochemical reaction. That is, a symmetrical cell can be manufactured in which the first electrode & the first electrode, the second electrode & the second electrode, and the third electrode & the third electrode are used as the working electrode & the counter electrode, respectively. Also, except for the reference electrode, a two-electrode symmetrical cell including the working electrode and the counter electrode can be used as the monocell.

In addition, a measuring device 210 for using the cyclic voltammetry may be connected to the monocell 200. The measuring device is a kind of a potentiostat and may further include a power supply for supplying a DC power, a voltage converter for converting the DC power of the power supply into a triangular wave voltage (ramping voltage), a buffer for outputting a desired voltage in accordance with the monocell 200 to be tested, and the like.

FIG. 2 illustrates a monocell of a type in which each electrode is added to an electrolyzer containing an electrolyte. For ease of measurement and stability, the same type of electrodes may be used as a working electrode 330 and a counter electrode 340 to be stacked with a separator 360 interposed therebetween to form a two-electrode symmetric cell. In this case, an electrolyte is injected into the monocell 300 and may undergo a wetting process to impregnate the electrolyte. Similarly, a measuring device 210 for using cyclic voltammetry may be connected to the monocell 300.

As described above, the electrolyte may be used as a reactant to the voltage applied to the working electrode, and may be a lithium salt non-aqueous electrolyte.

The lithium salt-containing non-aqueous electrolyte solution consists of an electrolyte and a lithium salt. And a non-aqueous organic solvent, an organic solid electrolyte, an inorganic solid electrolyte, and the like are used as the electrolyte solution.

Examples of the non-aqueous organic solvent include N-methyl-2-pyrrolidinone, propylene carbonate, ethylene carbonate, butylenecarbonate, dimethyl carbonate, diethyl carbonate, gamma-Butyrolactone, 1,2-dimethoxyethane, tetrahydroxyfuran, 2-methyltetrahydrofuran, dimethylsulfoxide, 1,3-dioxolane, formamide, dimethylformamide, dioxolane, acetonitrile, nitromethane, methyl formate, methyl acetate, phosphoric acid triester, trimethoxymethane, dioxolane derivatives, sulfolane, methyl sulfolane, 1,3-dimethyl- 2-imidazolidinone, propylene carbonate derivatives, tetrahydrofuran derivatives, ethers, methyl pyrophosphate, ethyl propionate, etc.

Examples of the organic solid electrolyte include a polymer electrolyte such as a polyethylene derivative, a polyethylene oxide derivative, a polypropylene oxide derivative, a phosphate ester polymer, an agitation lysine, a polyester sulfide, a polyvinyl alcohol, a polyvinylidene fluoride, a polymerizer including an ionic dissociation group, and the like.

Examples of the inorganic solid electrolyte include nitrides, halides, and sulfates of Li such as $Li_3N$, $LiI$, $Li_5NI_2$, $Li_3N$—$LiI$—$LiOH$, $LiSiO_4$, $LiSiO_4$—$LiI$—$LiOH$, $Li_2SiS_3$, $Li_4SiO_4$, $Li_4SiO_4$—$LiI$—$LiOH$, and $Li_3PO_4$—$Li_2S$—$SiS_2$.

The lithium salt is a substance that is soluble in the non-aqueous electrolyte. The examples of the lithium salt include $LiCl$, $LiBr$, $LiI$, $LiClO_4$, $LiBF_4$, $LiBioClio$, $LiPF_6$, $LiCF_3SO_3$, $LiCF_3CO_2$, $LiAsF_6$, $LiSbF_6$, $LiAlCl_4$, $CH_3SO_3Li$, $(CF_3SO_2)_2NLi$, chloroborane lithium, lower aliphatic carboxylic acid lithium, lithium 4-phenylborate, imide and the like.

For the purpose of improving charge/discharge characteristics, flame retardancy, etc., pyridine, triethylphosphite, triethanolamine, cyclic ether, ethylenediamine, n-glyme, hexaphosphoric triamide, nitrobenzene derivative, sulfur, quinone imine dye, N-substituted oxazolidinone, N,N-substituted imidazolidine, ethylene glycol dialkyl ether, ammonium salt, pyrrole, 2-methoxyethanol, aluminum trichloride, etc. may be added to the electrolyte. In some cases, a halogen-containing solvent such as carbon tetrachloride or ethylene trifluoride may be further added to impart nonflammability, or a carbon dioxide gas may be further added to improve the high-temperature storage characteristics, and FEC (Fluoro-EthyleneCarbonate), PRS (Propene sultone), and the like may be further added.

In one preferred example, a lithium salt such as $LiPF_6$, $LiClO_4$, $LiBF_4$, and $LiN(SO_2CF_3)_2$ may be added to a mixed solvent of a cyclic carbonate of EC or PC which is a high-dielectric solvent and a linear carbonate of DEC, DMC or EMC which is low viscosity solvent to thereby prepare a non-aqueous electrolyte containing a lithium salt.

Further, the separator is interposed between the positive electrode and the negative electrode, and an insulating thin film having high ion permeability and mechanical strength is used. The pore diameter of the separator is generally 0.01 to 10 micrometers, and the thickness is generally 5 to 300 micrometers. Examples of such a separator include olefin-based polymers such as polypropylene which is chemically resistant and hydrophobic; a sheet or a nonwoven fabric made of glass fiber, polyethylene or the like. When a solid electrolyte such as a polymer is used as the electrolyte, the solid electrolyte may also serve as a separator.

When the cell manufacturing step (S20) is completed, the capacitance of each electrode used in the monocell from the monocell having the symmetric cell form is measured (S30).

The capacitance measuring step (S30) is a step of measuring the capacitance of the electrode by cyclic voltammetry for the monocell.

Cyclic voltammetry is one of the most direct methods of determining what kind of reaction is occurring on or near the electrode surface among many electrochemical measurements. It is useful as an early diagnosis of the electrode reaction of electrochemically active redox species. The most basic CV is a method of analyzing the species information by applying a voltage and measuring the redox reaction of the species occurring at the working electrode. Herein, when the voltage is applied, a triangular wave-type voltage (ramping voltage) that increases or decreases the voltage at a constant speed is applied, and an electrochemical reaction occurs at the working electrode as the voltage is applied.

Specifically, the capacitance measurement step (S30) includes: applying a voltage to the symmetric cell at a predetermined scan rate; measuring current to measure the response current according to the applied voltage; and showing a cyclic voltammogram curve in the relationship between the scan rate of the applied voltage and the response current, and calculating the capacitance therefrom.

In the voltage application step, a triangular wave type voltage (ramping voltage) as described above is applied to the monocell. FIG. 4 is a graph showing the shape and voltage scan rate of the voltage applied to a monocell in a method for measuring the active area of a non-destructive active material according to the present invention.

Referring to FIG. 4, the solid line is in the form of a voltage applied to the monocell, and the dotted line is the scan rate of the voltage applied to form the voltage. Here, the scan rate of the voltage means an amount of change in voltage over time. As can be seen in FIG. 4, after applying a voltage that increases at a constant rate in one direction, when the voltage reaches a certain magnitude, the voltage that is changing at the same rate is applied in the same direction and the process is repeated. At this time, the scan rate of the voltage is changed to calculate the capacitance.

When a voltage having a predetermined scan ratio is applied as described above in the voltage application step, the current measurement step measures and records the response current that changes according to the applied voltage.

The value of the current according to the scan rate and the applied voltage (potential) is shown in a cyclic voltammogram. FIG. 5 is a graph illustrating a general cyclic voltammogram curve according to a voltage scan ratio. Referring to FIG. 5, whenever the scan rate is changed, the shape of the cyclic voltammogram curve is also changed because the concentration of the oxidized and reduced species present at the interface is changed when the scan rate is changed. In order to generate the cyclic voltammogram, a constant voltage is applied at one point and the current observed accordingly. If the scan rate gets large, the measurement speed in each section becomes high, and the ion distribution and concentration at the interface become different during the short time.

In addition, referring to FIG. 5, the x-axis denotes a voltage (potential), and the y-axis denotes a magnitude of a response current according thereto. As shown in FIG. 4, since a voltage increasing at a constant rate is applied in one direction, and the voltage changing at the same rate is applied in the opposite direction at a time point when the voltage reaches a predetermined magnitude, the cyclic voltammogram curve may have a positive value of the x-axis value (voltage value) (V>0) or a negative value (V<0). In general, the cyclic voltage current curve has a symmetrical shape with respect to the origin.

When the cyclic voltammogram is shown in the capacitance calculation step, a linear regression method of calculating the slope by plotting the response current according to the voltage scan ratio in a straight line in the cyclic voltammogram may be used. At this time, the response current according to the voltage scan ratio is preferably measured at the point where the value of the axis of symmetry, that is, the x-axis, is 0 V. In general, when the electrochemical reaction occurs in the cyclic voltammetry, the peak appears sharp. However, since the Faraday reaction does not occur in the cell because the cyclic voltammetry is performed using the same electrode, the current value at the zero voltage point is read.

In the graph of response current according to the voltage scan ratio, the slope is a value related to capacitance. In general, the relationship between the charge q and the voltage V is defined as follows:

$$q = CV \quad \text{[Formula 2.1]}$$

Herein, the constant C is called capacitance, and the unit is denoted by F. That is, the capacitance of an ideal electrode is defined as the charge collected on the surface for a given potential (C=q/V), and the capacitance of the object is proportional to the surface area of the material.

The derivative of the above formula is obtained as follows.

$$\frac{dq}{dt} = C\frac{dV}{dt} \quad \text{[Formula 2.2]}$$

In the above formula, dQ/dt denotes the amount of change in current over time, and dV/dt denotes the amount of change in voltage over time, indicating a scan rate (V'). This is summarized as follows.

$$I = CV' \quad \text{[Formula 2.3]}$$

In other words, in the graph of current versus scan rate of voltage, the current is proportional to the scan rate, with the proportionality constant being the capacitance. In other words, the slope of the graph means capacitance. In the present invention, the value obtained by multiplying twice the slope obtained in the graph is the capacitance of the electrode. This value reflects the use of two identical electrodes.

When the capacitance of each electrode (first electrode, second electrode, third electrode) is measured, the active area of the electrode active material is calculated from the capacitance measurement value (S40). The active area of the electrode active material may be calculated by the following Formula 1.

$$A_{A.M} = (C_{total} - C_{CNT} * A_{CNT})/C_{A.M} \quad \text{[Formula 1]}$$

(In Formula 1, $A_{A.M}$ denotes the active area (m$^2$) of the electrode active material in the electrode mixture coated on the first electrode, $A_{CNT}$ denotes the surface area (m$^2$) of the conductive material (CNT) in the electrode mixture coated on the first electrode, $C_{total}$ denotes the capacitance (F) of the first electrode, $C_{CNT}$ denotes the capacitance per unit surface area of the conductive material (F/m$^2$), and $C_{A.M}$ denotes the capacitance per unit surface area of the electrode active material (F/m$^2$).)

Formula 1 is derived from Formula 1.1 below to obtain the capacitance of the first electrode.

$$C_{total} = C_{A.M} * A_{A.M} + C_{CNT} * A_{CNT} \quad \text{[Formula 1.1]}$$

(In Formula 1, $A_{A.M}$ denotes the active area (m$^2$) of the electrode active material in the electrode mixture coated on the first electrode, $A_{CNT}$ denotes the surface area (m$^2$) of the conductive material (CNT) in the electrode mixture coated on the first electrode, $C_{total}$ denotes the capacitance (F) of the first electrode, $C_{CNT}$ denotes the capacitance per unit surface area of the conductive material (F/m$^2$), and $C_{A.M}$ denotes the capacitance per unit surface area of the electrode active material (F/m$^2$).)

Formula 1.1 may be obtained on the assumption that the capacitance of the first electrode including the electrode active material and the conductive material is the sum of the capacitance of the electrode active material constituting the first electrode and the capacitance of the conductive material. In addition, as described above, since the capacitance is proportional to the surface area of the material, the capacitance of the electrode active material and the capacitance of the conductive material may be defined as a value obtained by multiplying the capacitance per unit area by the surface area of each material. In addition, $A_{A.M}$ means the active area of the active material as the surface area of the active material in the first electrode. In addition, it is assumed that $C_{CNT}$ is the capacitance per unit surface area of the conductive material and is equal to the capacitance value per unit surface area of the third electrode, and $C_{A.M}$ is assumed to be the same capacitance per unit surface area of the second electrode as the capacitance per unit surface area of the active material.

In the above Formula 1, $C_{total}$ is obtained by measuring the capacitance of the first electrode.

On the other hand, $C_{A.M}$ denotes the capacitance value per unit surface area can be obtained by dividing the capacitance measurement value $C_2$ of the second electrode by the surface area $A_2$ of the second electrode.

$$C_{A.M} = C_2/A_2 \quad \text{[Formula 1.2]}$$

The surface area is measured by the Brunauer-Emmett-Teller (BET) measuring method. Here, BET is a method of analyzing the specific surface area and pore size distribution of a sample by making a specific gas adsorb to the surface of a solid sample, and measuring the adsorption amount for each partial pressure. Specifically, the specific surface area may be calculated from the nitrogen gas adsorption amount under the liquid nitrogen temperature (77K) using BEL-SORP-mino II of BEL Japan company.

Since the BET measurement value is the specific surface area of the material (area per weight, m$^2$/g), the surface area $A_2$ of the second electrode can be obtained by multiplying the BET specific surface area value (obtained by measurement) of the second electrode by the weight of the electrode active material coated on the second electrode.

Similarly, $C_{CNT}$ is a value obtained by dividing the capacitance measurement value $C_3$ of the third electrode by the surface area $A_3$ of the third electrode.

$$C_{CNT} = C_3/A_3 \quad \text{[Formula 1.3]}$$

The surface area $A_3$ of the third electrode may be obtained by multiplying the measured BET specific surface area of the third electrode by the weight of the conductive material coated on the third electrode. Herein, in the case of using carbon nanotubes as the conductive material, when calculating the surface area $A_3$ of the third electrode, a BET value (280 m$^2$/g) of a typical carbon nanotube (CNT) may be used as BET specific surface area value, instead of directly measuring the specific surface area of the third electrode.

In addition, in Formula 1, $A_{CNT}$ is the surface area of the conductive material (CNT) in the electrode mixture coated on the first electrode. This can be obtained by multiplying the weight of the conductive material used for the first electrode with the BET value (280 m$^2$/g) of the general carbon nanotubes (CNT) when using carbon nanotubes as a conductive material.

In summary, in order to obtain the active area of the active material of Formula 1, first, capacitance ($C_{total}$, $C_2$, $C_3$) of each electrode is measured, and the BET specific surface areas (m$^2$/g) of the second and third electrodes is obtained. Thereafter, the capacitance value per unit surface area ($C_{A.M}$, $C_{CNT}$) is obtained by dividing capacitance values $C_2$ and $C_3$ of the second and third electrodes by a value which is obtained by multiplying the BET specific surface area by the weight of the electrode active material and the conductive material coated on the second electrode and the third electrode, respectively. Finally, the active area of the active material is obtained by substituting the obtained capacitance values per unit surface area ($C_{A.M.}$, $C_{CNT}$) in Formula 1.

Hereinafter, the present invention will be described in detail with reference to examples. However, the embodiments according to the present invention may be modified into various other forms, and the scope of the present invention should not be construed as being limited to the examples described below. The examples of the present invention are provided to more fully describe the present invention to those skilled in the art.

EXAMPLE

Preparation Example 1

Preparation of First Electrode

A copper foil having a width of 1000 mm and a thickness of 10 μm was used as the electrode current collector. 97.9 wt % $LiNi_{0.815}Co_{0.15}Al_{0.035}O_2$ as positive electrode active material, 0.5 wt % carbon nanotube (CNT) as conductive material, 1.5 wt % polyvinylidene fluoride (PVDF) as binder and 0.1 wt % PVDF as dispersant were added to N-methyl-2 pyrrolidone (NMP) which is a solvent, to thereby prepare a positive electrode mixture slurry. Thereafter, the slurry was coated on the current collector with a loading amount of 3.2 mAh/cm², and was dried to prepare an electrode. Thereafter, the electrode was roll-pressed.

Preparation of Second Electrode

An electrode was prepared in the same manner as the first electrode except that 99.5% by weight of the positive electrode active material $LiNi_{0.815}Co_{0.15}Al_{0.035}O_2$ as the electrode mixture were mixed with 0.5% by weight of PVDF as a binder and the mixture was then coated with a loading amount of 3.2 mAh/cm² on the current collector.

Preparation of Third Electrode 0.5 wt % of carbon nanotubes (CNT) and 1 wt % of polyvinylpyrrolidone as a dispersant, based on the total weight of the dispersion liquid, were added to a dispersion medium consisting of co-solvent in which distilled water and isopropyl alcohol were mixed in a weight ratio of 3:7 as the electrode mixture. Subsequently, the mixture was mixed for 1 hour using a homogeneous mixer (VMA LC55, Impeller/3000 rpm). The resulting mixture was milled for 90 minutes using NETZSCH Mini-cer (bead average diameter: 1 mm, 3000 rpm) to obtain a carbon nanotube pre-dispersion liquid. An electrode was manufactured in the same manner as the first electrode except that the pre-dispersion liquid was coated on the current collector.

Preparation of Mono Cells

An electrode assembly was manufactured by assembling in a stacking manner by interposing a polyethylene separator between the first electrode and the first electrode.

After deriving the positive electrode tab and the negative electrode tab from the positive electrode plate and negative electrode plate, respectively, each of the positive electrode tab and the negative electrode tab was wrapped with the same material and the same thickness of the adhesive tab film so that the positive electrode tab and the negative electrode tab may include all of the portions overlapping with the sealing portion.

An aluminum foil metal foil layer was formed on a CPP heat insulating layer (thickness 40 μm), and a pouch case was then manufactured by laminating an insulating layer made of nylon on the aluminum foil metal foil layer. After bending the manufactured pouch exterior material to form an upper exterior material and a lower exterior material, the electrode assembly receiving portion was formed in the lower exterior material through a pressing process.

The prepared electrode assembly was accommodated in the receiving portion, and then 500 μl of an electrolyte (prepared by adding $LiPF_6$ 1M into a solvent which is generated by mixing ethylene carbonate (EC) with ethyl methyl carbonate (EMC) at a weight ratio of 3:7) was injected. Then the upper exterior material was made to be in contact with the lower electrode assembly, and the sealing part was heat-sealed to form a seal. And the electrolyte was impregnated in the electrode assembly for 1 day.

In addition, monocells using the same type of electrode were prepared using the second electrode and the third electrode, respectively.

Preparation Example 2

Electrodes and monocells were prepared in the same manner as in Preparation Example 1, except that the conductive material dispersion conditions of the respective electrodes were different. At this time, in order to change the conductive material dispersion conditions, the conductive material dispersion was carried out three times as compared to the preparation example 1 subjected to only one step of the conductive material dispersion.

Experimental Example 1

Capacitance Measurement of Each Electrode

The measuring device was connected to the monocell and voltage was applied at various scan rates. The voltage was applied at scan rates of 5 mV/s, 10 mV/s, 15 mV/s, and 20 mV/s, and the voltage of the positive electrode was ramped from 0.1V to −0.1V and then returned to 0.1V.

As described above, the magnitude of the response current was recorded while applying a voltage at a constant scan rate to illustrate a cyclic voltammogram. The cyclic voltammograms of the monocell using the first electrode, the second electrode, or the third electrode in Preparation Example 1 are shown in FIG. 6. (a) is a cyclic voltammogram of a monocell using a first electrode, (b) is a cyclic voltammogram of a monocell using a second electrode, and (c) is a cyclic voltammogram of a monocell using a third electrode.)

In a similar manner, the cyclic voltammogram of the monocell in Preparation Example 2 is shown in FIG. 8.

After obtaining the cyclic voltammogram, the current values at the points where the x-axis value according to each scan rate was 0 V in the cyclic voltammogram was obtained, and the current values were drawn in a straight line to obtain its slope. Preparation Example 1 is shown in FIG. 7, and Preparation Example 2 is shown in FIG. 9.

The capacitances of the first electrode, the second electrode, and the third electrode ($C_{total}$, $C_2$, $C_3$) were calculated in Preparation Example 1 and Preparation Example 2 by multiplying the slope values of the straight lines shown in FIGS. 7 and 9 by 2, respectively, and the results are shown in Table 1.

Calculation of Active Area of Electrode Active Material

The specific surface area of the second electrode was measured by BET (calculated from the amount of nitrogen gas adsorption under liquid nitrogen temperature (77K) using BELSORP-mino II manufactured by BEL Japan), and the surface area A2 of the second electrode was obtained by multiplying the BET measurement value by the weight of the electrode active material. Subsequently, The capacitance per unit surface area ($C_{A.M}$) of the electrode active material was calculated by dividing the capacitance $C_2$ of the second electrode by the surface area $A_2$ of the second electrode.

In addition, the surface area ($A_3$) of the third electrode was obtained by multiplying the general specific surface area (280 m²/g) of the carbon nanotubes by the weight of the carbon nanotube conductive material coated on the third electrode. Subsequently, The capacitance per unit surface area ($C_{CNT}$) of the conductive material was calculated by dividing the capacitance $C_3$ of the third electrode by the surface area $A_3$ of the third electrode.

Lastly, the surface area of the conductive material (CNT) was obtained from the electrode mixture coated on the first electrode by multiplying the specific surface area (280 m²/g) of the carbon nanotubes by the weight of the conductive material used for the first electrode.

And $A_{A.M}$ was calculated by substituting the values $C_{total}$, $C_{CNT}$, $C_{A.M}$, and $A_{CNT}$ in Formula 1 below. Each of $C_{total}$, $C_{CNT}$, $C_{A.M}$, $A_{CNT}$ and $A_{A.M}$ are shown in Table 1.

$$A_{A.M} = (C_{total} - C_{CNT} * A_{CNT})/C_{A.M} \quad \text{[Formula 1]}$$

(In Formula 1, $A_{A.M}$ denotes the active area (m²) of the electrode active material in the electrode mixture coated on the first electrode, $A_{CNT}$ denotes the surface area (m²) of the conductive material (CNT) in the electrode mixture coated on the first electrode, $C_{total}$ denotes the capacitance (F) of the first electrode, $C_{CNT}$ denotes the capacitance per unit surface area of the conductive material (F/m²), and $C_{A.M}$ denotes the capacitance per unit surface area of the electrode active material (F/m²).)

TABLE 1

| Measured/calculated value | Preparation Example 1 | Preparation Example 2 |
|---|---|---|
| $C_{total}$(F) | 0.0301 | 0.0323 |
| $C_2$(F) | 0.0474 | 0.0474 |
| $C_3$(F) | 0.0552 | 0.0552 |
| $A_2$(m²) | 0.114 | 0.114 |
| $A_3$(m²) | 1.0915 | 1.0915 |
| $C_{A.M}$(F/m²) | 0.415 | 0.415 |
| $C_{CNT}$(F/m²) | 0.0506 | 0.0506 |
| $A_{CNT}$(m²) | 0.251 | 0.253 |
| $A_{A.M}$(m²) | 0.0419 | 0.0470 |

Experimental Example 2

The surfaces of the first electrodes prepared from Preparation Examples 1 and 2 were observed with a scanning electron microscope (SEM), and the results are shown in FIGS. 10 and 11. The active area rate of the active material to the total electrode mixture was calculated therefrom. In this case, the active region of the active material in FIGS. 10 and 11 refers to a bright portion not surrounded by the CNT.

And the active area of the active material was calculated by the following formula 3, and the results are shown in Table 2 below.

$$\text{Active area rate}(\%) = \frac{\text{Active area of electrode active material in the first electrode}(A_{A.M}, m^2)}{\text{BET value of electrode active material}(m^2/g) \times \text{weight of active material in the first electrode}(g)} \times 100 \quad \text{[Formula 3]}$$

At this time, the BET value of the electrode active material is considered to be the same as the BET value of the second electrode coated with only the active material.

TABLE 2

| Measured/calculated value | Preparation Example 1 | Preparation Example 2 |
|---|---|---|
| SEM(%) | 39 | 43 |
| Formula 3 (%) | 40.8 | 45.4 |

In Table 2, SEM denotes the active area ratio obtained from SEM image analysis, and Formula 3 means the active area rate calculated through Formula 3 from the active area derived from the capacitance.

In addition, as shown in the above table, it is seen that the result derived from the capacitance is similar to the active area ratio size obtained through SEM image analysis. The difference is understood to be generated due to the difference obtained by areaizing the three-dimensional area into a planar image in the image analysis.

As explained above, In the method for measuring the active area of an active material according to the present invention, by measuring the capacitance of the electrode coated with the target electrode active material and measuring the active area of the active material therefrom, an accurate active area measurement can be obtained without damaging the electrode, and the time required for measurement can be reduced.

DESCRIPTION OF REFERENCE NUMERALS

200: monocell
210: measuring device
220: electrolyte
230: working electrode
240: counter electrode
250: reference electrode
300: monocell
330: working electrode
340: counter electrode
360: separator

The invention claimed is:

1. A method for measuring an active area of a non-destructive active material, the method comprising:
    manufacturing three electrodes comprising a first electrode coated with an electrode mixture containing an electrode active material and a conductive material, a second electrode coated with an electrode mixture containing the electrode active material as its main component and not containing the conductive material, and a third electrode coated with an electrode mixture containing no electrode active material and containing the conductive material as its main component;
    manufacturing three monocells using the first, second and third electrodes;
    measuring a capacitance of each of the first, second and third electrodes used in the monocells; and calculating an active area (m²) of the electrode active material by a following Formula 1, $$A_{A.M} = (C_{total} - C_{CNT} * A_{CNT})/C_{A.M}$$ [Formula 1]

in Formula 1, $A_{A.M}$ denotes the active area (m²) of the electrode active material coated on the first electrode, $A_{CNT}$ denotes a surface area (m²) of the conductive material coated on the first electrode, $C_{total}$ denotes a capacitance (F) of the first electrode, $C_{CNT}$ denotes a capacitance per unit surface area of the conductive material (F/m²), and $C_{A.M}$ denotes the capacitance per unit surface area of the electrode active material (F/m²).

2. The method of claim 1, wherein the surface area of the conductive material or the electrode active material is measured by Brunauer-Emmett-Teller (BET).

3. The method of claim 1, wherein the monocells comprise two-electrode symmetric cells using the first, second and third electrodes.

4. The method of claim 1, wherein the conductive material comprises a carbon nanotube (CNT).

5. The method of claim 1, wherein the electrode active material comprises a positive electrode active material, and an electrode including the positive electrode active material is a positive electrode.

6. The method of claim 1, wherein the electrode active material comprises a lithium nickel cobalt manganese composite oxide.

7. The method of claim 1, wherein the measuring the capacitance includes measuring the capacitance of the electrode by cyclic voltammetry for the monocells.

8. The method of claim 7, wherein the measuring of the capacitance comprises:

applying a voltage to the monocells at a constant scan rate;

measuring a response current according to the applied voltage; and showing a cyclic voltammogram from a relationship between the scan rate of the applied voltage and the response current and calculating capacitance therefrom.

9. The method of claim 8, wherein the capacitance is calculated by using a linear regression method of obtaining a slope by plotting response currents according to the voltage scan rate in a straight line.

10. The method of claim 8, wherein the response current is measured at a point where an x-axis value is 0 V in the cyclic voltammogram when measuring the current.

11. The method of claim 1, wherein the first electrode further includes a binder and a dispersant, and a weight ratio of the electrode active material, the conductive material, the binder, and the dispersant is 95:3:1.5:0.5 to 98:0.5:1:0.5 in the first electrode.

12. The method of claim 1, wherein the second electrode contains 99.5 to 99.8% by weight of the electrode active material.

13. The method of claim 1, wherein the electrode mixture of the third electrode comprises a pre-dispersion liquid containing a conductive material as its main component.

* * * * *